United States Patent [19]

Ahn

[11] Patent Number: 5,201,450
[45] Date of Patent: Apr. 13, 1993

[54] HEAT BLOCK OF WIRE BONDING MACHINE

[75] Inventor: Tae K. Ahn, Choongcheongbook-Do, Rep. of Korea

[73] Assignee: Goldstar Electron Co., Ltd., Choongchungbook-Do, Rep. of Korea

[21] Appl. No.: 845,095

[22] Filed: Mar. 3, 1992

[30] Foreign Application Priority Data

Jul. 15, 1991 [KR] Rep. of Korea ............. 10945/1991

[51] Int. Cl.$^5$ ................................ B23K 37/00
[52] U.S. Cl. ................... 228/4.5; 228/6.2; 219/85.18; 219/85.16; 219/228; 219/243
[58] Field of Search ............ 228/4.5, 6.2, 179, 180.2, 228/227, 228; 432/424, 425, 426; 219/85.18, 85.16, 228, 243, 457, 460, 476, 478; 156/583.1

[56] References Cited

U.S. PATENT DOCUMENTS

| | | | |
|---|---|---|---|
| 4,485,290 | 11/1984 | Fegley et al. | 219/85.16 |
| 4,870,251 | 9/1989 | Anemaet | 219/243 |
| 4,883,214 | 11/1989 | Zimmer | 219/85.18 |
| 4,891,496 | 1/1990 | Zimmer | 219/85.16 |
| 4,910,383 | 3/1990 | Zimmer | 219/85.16 |

FOREIGN PATENT DOCUMENTS

| | | |
|---|---|---|
| 0048938 | 4/1980 | Japan. |
| 0096940 | 4/1989 | Japan. |
| 0192470 | 8/1989 | Japan. |

*Primary Examiner*—Richard K. Seidel
*Assistant Examiner*—Chuck Y. Mah
*Attorney, Agent, or Firm*—Lowe, Price, LeBlanc & Becker

[57] ABSTRACT

A heat block of a wire bonding machine including an inner lead heating part for bonding each one end of wires to each inner lead of a lead frame, a chip heating part for bonding the other ends of the wires to a semiconductor chip, and a differentially heating member for heating the inner lead heating part of the heat block at a relatively higher temperature than that of the chip heating part of the heat block. The heat block of this invention provides advantage in that the chip heating part is heated at a proper heating temperature, at which temperature the semiconductor chip is not injured, while the inner lead heating part is heated at a relatively higher temperature than that of the chip heating part, thereby considerably improving the bonding effect at the bonding portions between the wires and the inner leads of the lead frame owing to the relatively higher heating temperature of the inner lead heating part than that of the chip heating part.

7 Claims, 7 Drawing Sheets

HEAT BLOCK OF WIRE BONDING MACHINE

BACKGROUND OF THE INVENTION

1. Field of the Invention

The present invention relates to a wire bonding machine for bonding opposite ends of wires to a semiconductor chip and a lead frame, respectively, and more particularly to a heat block of such a wire bonding machine in which an inner lead heating part thereof is heated at a relatively higher heating temperature than that of a chip heating part thereof so that the bonding effect is improved at the bonding portions between the wires and inner leads of the lead frame without occurrence of damage of the semiconductor chip due to the heating temperature.

2. Description of The Prior Art

Conventionally, wire bonding machines are widely used for connecting a semiconductor chip to a lead frame by bonding opposite ends of a plurality of wires, such as gold wires, to a semiconductor chip and inner leads of the lead frame, respectively, for manufacturing a semiconductor package. The wire bonding machine is generally provided with a heat block for providing a bonding heat for the bonding portions between the opposite ends of the wires and the semiconductor chip and the inner leads of the lead frame.

With reference to FIG. 1 which shows a known heat block of a wire bonding machine according to the prior art, the heat block includes upper and lower heating blocks 10 and 20 of which the upper heating block 10 is provided thereon with a chip heating part 11 for allowing a semiconductor chip (not shown) and one end of each wire to be laid thereon so as to be heated and bonded and an inner lead heating part for allowing the other end of the wire and the inner leads of the lead frame (not shown) to be laid thereon so as to be heated and bonded.

In addition, the lower heating block 20 is provided with a pair of receiving holes 20a and 20b formed as longitudinally machined and spaced apart from each other in parallelism and adapted for receiving a heater 31 and thermocouple 33, respectively.

In bonding operation, the heat block is heated by the heater 31 at a predetermined temperature, then receives thereon the lead frame which has been provided with a semiconductor chip on the heating parts 11 and 12 of the upper heating block 10, thereafter, the lead frame on the heating parts 11 and 12 is clamped by a clamp 43. In result, the capillary chip is connected to the inner leads of the lead frame by bonding both ends of the wires to the chip and the inner leads.

However, the known heat block has disadvantage in that the heating temperatures of respective heating parts are controlled at the same time by means of the single thermocouple 33 under the condition of being controlled by a temperature control device so that it is impossible to control a first heating temperature for bonding one end of each wire to the chip differently from a second heating temperature for bonding the other end of the wire to each inner lead of the lead frame. In other words, the first heating temperature in bonding operation is generally desired to be controlled at about 200°±10° C.

Here, it is well known that the higher heating temperature is maintained, the high bonding effect is accomplished, thus it is desired to control the heating temperature for bonding the wire to the chip and the inner lead to be higher than the above temperature of 200°±10° C. However, the heating temperature above 200°±10° C. will damage the semiconductor chip due to a relatively lower heat resistance of the semiconductor chip so that the heat block can not be heated to a temperature above 200°±10° C. In result, the known heat block has disadvantage in that it can not provide a good bonding effect in the bonding portion between the wires and the inner leads of the lead frame due to the relatively lower heating temperature of about 200°±10° C.

SUMMARY OF THE INVENTION

It is, therefore, an object of the present invention is to provide a heat block of a wire bonding machine in which the above disadvantages of the known heat block can be overcome and an inner lead heating part thereof is heated to a relatively higher temperature than that of a chip heating part thereof so that the bonding effect is improved at the bonding portions between the wires and the inner leads of the lead frame without occurrence of damage in the semiconductor chip due to the heating temperature.

It is another object of the present invention to provide a differential heating means for differentially heating the chip heating part and the inner lead heating part of the heat block.

It is still another object of the present invention to provide thermal insulation members for insulating the chip heating part from the inner lead heating part of the heat block, thereby accomplishing the differential heating for the chip heating part and the inner lead heating part of the heat block.

It is still another object of the present invention to provide a radiant air circulation member for cooling the chip heating part, thereby accomplishing the differential heating for the chip heating part and the inner lead heating part of the heat block.

The above-mentioned objects of the present invention can be accomplished by providing a heat block of a wire bonding machine including differentially heating means for heating an inner lead heating part of the heat block at a relatively higher temperature than that of a chip heating part of the heat block, the inner lead heating part and the chip heating part adapted for bonding opposite ends of wires to inner leads of a lead frame and semiconductor chip, respectively.

In one embodiment, the differentially heating means includes a pair of second heaters and a pair of second heaters and a pair of second thermocouples each of which is crossly provided in each side of an upper heating block under the inner lead heating part, a first heater and a first thermocoupled which are disposed in a lower heating block, and thermal insulation members which are provided as laying in said upper heating block in order to each surround one of the second heaters and one of the second thermocouples.

In another embodiment, the differentially heating means includes an insert opening which is vertically formed at a center portion of the inner lead heating part of an upper heating block, a separate-type chip heating block which is made of a material of relative lower thermal conductivity than that of the upper heating block and adapted for being received in the insert opening, and also has an upper surface functioning as the chip heating part, and a heater and a thermocoupled which are mounted in one heating block of the upper heating block and a lower heating block without distinction of the upper and lower heating blocks.

In still another embodiment, the differentially heating means includes a radiant opening formed in an upper heating block under the chip heating part in order to allow a radiant air to circulate therethrough and a heater and a thermocouple which are mounted in one heating block of the upper heating block and a lower heating block, the lower heating block adapted for supporting the upper heating block thereon, without distinction of the upper and lower heating blocks.

In still another embodiment, the differentially heating means includes a first heater and a first thermocouple which are crossly disposed in an upper heating block under the chip heating part, a pair of second heaters and a pair of second thermocouples each crossly provided in each side of the upper heating block under the inner lead heating part and thermal insulation members which are provided as laying in the upper heating block in order to each surround one second heater and one second thermocouple.

In still another embodiment, the differentially heating means includes a thermal insulation plate which is disposed between upper and lower heating blocks for insulating therebetween, an insert opening vertically formed inside the inner lead heating part of the upper heating block and an insert part which is formed as upwardly extending from an upper surface of the lower heating block so as to be inserted into the insert opening of the upper heating block, and is covered on the side surfaces thereof with a thermal insulation part which is integrally formed with the thermal insulation plate, the insert part having an upper surface functioning as the chip heating part, a first heater and a first thermocouple which are longitudinally disposed in a center portion of the lower heating block and a pair of second heaters and a pair of second thermocouples each longitudinally provided in each side of the upper heating block under the inner lead heating part.

BRIEF DESCRIPTION OF THE DRAWINGS

Other objects and aspects of the invention will become apparent from the following description of embodiments with reference to the accompanying drawings, in which:

FIGS. 2 to 5 show an embodiment of a heat block of a wire bonding machine according to this invention, respectively, in which:

FIG. 2 is an exploded perspective view;

FIG. 3 is a sectional view taken along the section line A—A of FIG. 2;

FIG. 4 is a sectional view taken along the section line B—B of FIG. 2; and

FIG. 5 circuit diagram showing an example of a heater controlling circuit;

FIGS. 7 to 9 shown a still another embodiment of a heat block of a wire bonding machine according to this invention, respectively, in which:

FIG. 7 is a partially perspective view;

FIG. 8 is a sectional view taken along the section line C—C of FIG. 7; and

FIG. 9 is a sectional view taken along the section line D—D of FIG. 7;

FIGS. 10 and 11 show a still another embodiment of a heat block of a wire bonding machine according to this invention, respectively, in which:

FIG. 10 is a partially exploded perspective view; and

FIG. 11 is a sectional view taken along the section line E—E of FIG. 10;

FIGS. 12 to 15 show a still another embodiment of a heat block of a wire bonding machine according to this invention, respectively, in which:

FIG. 12 is a perspective view;

FIG. 13 is an exploded perspective view; and

FIGS. 14 and 15 are sectional views taken along the section lines F—F and G—G of FIG. 13, respectively.

DETAILED DESCRIPTION OF THE PREFERRED EMBODIMENTS

Figure 2:
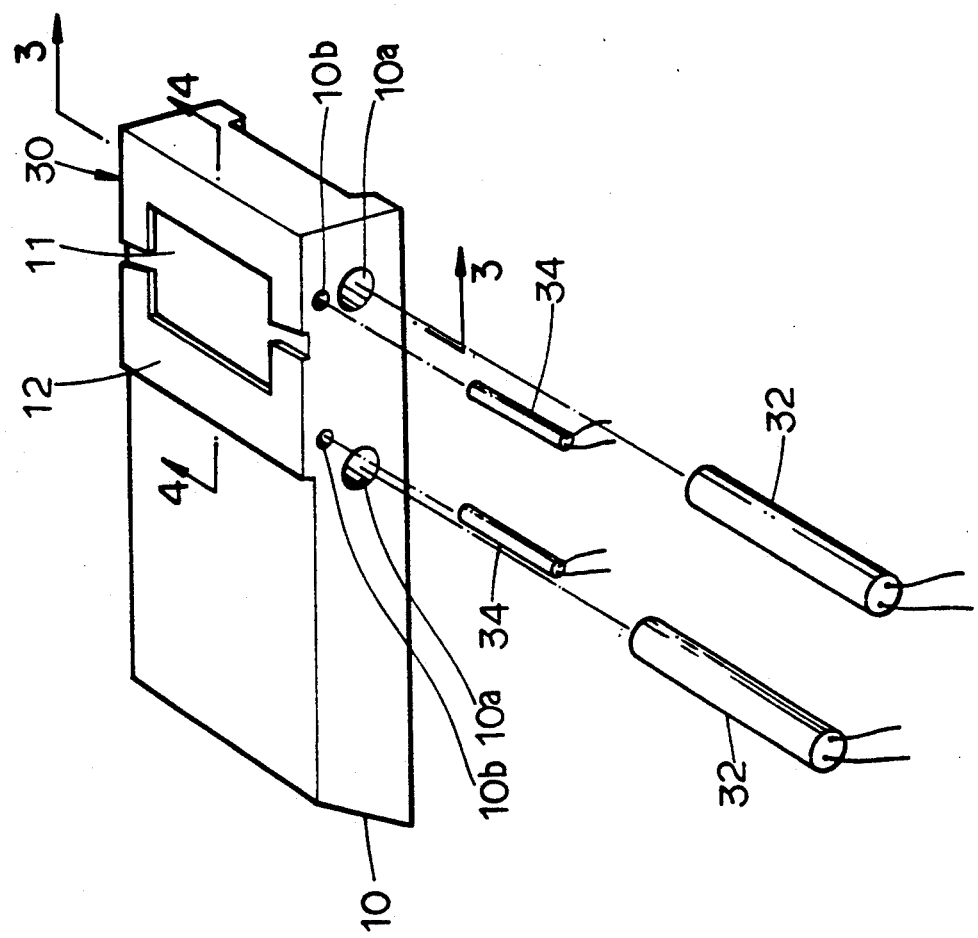
Figure 3:
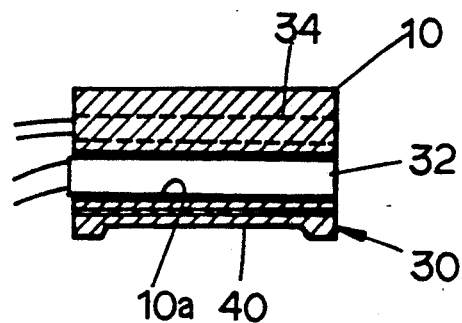
Figure 4:
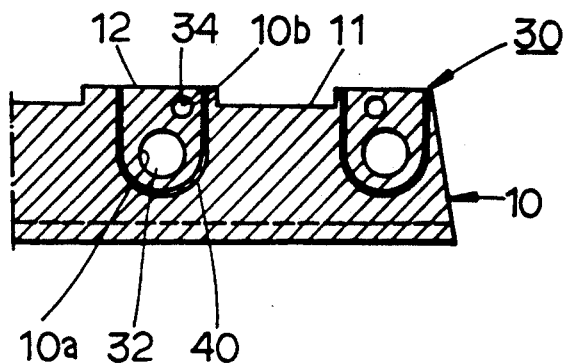

Referring first to FIGS. 2 to 4 which show a first embodiment of a heat block of a wire bonding machine according to this invention, the heat block includes a differential heating device 30 for differentially heating an inner lead heating part of the heat block at a relatively higher temperature than that of a chip heating part of the heat block. Here, as described in the description for the prior art, the inner lead heating part and the chip heating part are adapted for bonding a plurality of inner leads of a lead frame to a semiconductor chip by using a plurality of wires, respectively.

Figure 1:
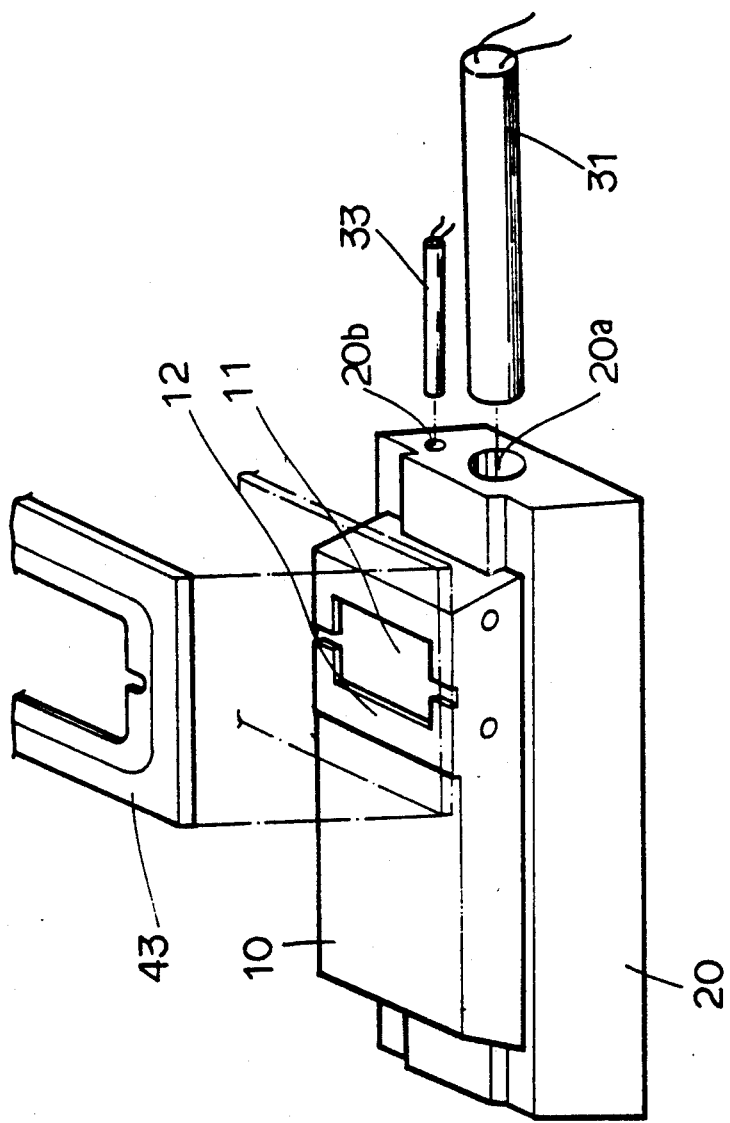
FIG. 1 is a perspective view showing a construction of a heat block of a wire bonding machine according to the prior art.

Even though there is not described in the drawings, the differential heating device 30 has, as described in the prior art in conjunction with FIG. 1, a heater 31, that is, a first heater, and a thermocouple 33, that is, a first thermocouple, which are received in a pair of receiving holes 20a and 20b formed as longitudinally machined in the lower heating block 20 and spaced apart from each other in parallelism. In addition, the heating device 30 includes a pair of second heaters 32 and a pair of second thermocouples 34, each provided at the upper heating block 10 as represented in FIG. 2. The second heaters 32 are received in a pair of receiving holes 10a, respectively, each said hole 10a being formed as crossly machined in each side of the upper heating block 10 and disposed so as to be parallel to each other. While, the second thermocouples 34 are received in a pair of receiving holes 10b, respectively, each said hole 10b being formed as crossly machined in each side of the upper heating block 10 near the hole 10a which receives the second heater 32. The receiving holes 10a and 10b are parallel to each other so that the heaters 32 and the thermocouples 34 are parallel to each other.

On the other hand, a pair of U-shaped cross-sectional thermal insulation members 40 are provided as laying in the upper heating block 10 in order to each surround one second heater 32 and one second thermocouple 34, as represented in FIGS. 3 and 4.

In accordance with this invention, the first and second heaters 31 and 32 are independently controlled by means of respective temperature control devices, thus the chip heating part 11 of the heat block is heated at the same temperature as described in the prior art, that is, the about 200°±10° C., while the inner lead heating part is heated at a relatively higher temperature than that of the chip heating part 11.

Figure 5:
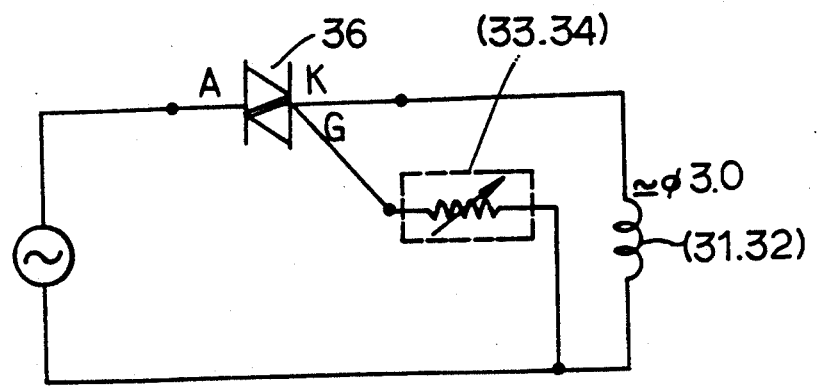

Turning next to FIG. 5 which is a circuit diagram showing an example of a heater controlling circuit for controlling the heaters 31 and 32, the circuit comprises the first and second heaters 31 and 32, the first and second thermocouples 33 and 34 for measuring the heating temperatures of the heaters 31 and 32 and a TRIAC 36 for controlling the power supply for the heaters 31 and 32 under the control of a gate signal corresponding to the temperature measurement for the heaters 31 and 32 by means of the thermocouples 33 and 34.

In bonding operation by using the heat block according to the first embodiment of this invention, the first heater 31 heats the upper and lower heating blocks 10 and 20 in order to heat the chip heating part 11, while the second heaters 32 heat the insides of the thermal insulation members 40 in order to heat the inner lead heating part 12. At this time, the chip heating part 11 and the inner lead heating part 12 are insulated from each other by means of the thermal insulation members 40 as described above, thus they are heated under the condition of thermal insulation therebetween, thereby causing the parts 11 and 12 to be differentially heated.

In addition, during the differential heating operation, the first and second thermocouples 33 and 34 always measure the temperatures of the heaters 31 and 32 in order to control the power supply for the heaters 31 and 32, respectively, so that the temperatures of the heaters 31 and 32 can be uniformly controlled.

Here, as described above, the first heater 31 heats the chip heating part at a proper temperature, for example, at about 200°±10° C., while the second heaters 32 heat the inner lead heating part 12 at a relatively higher temperature than that of the chip heating part. At this state, the bonding operation is carried out for the first and second bonding portions, that is, a first portion between one end of the wire and the semiconductor chip on the chip heating part 11 and a second portion between the other end of the wire and the inner lead of the lead frame on the inner heating part 12. In result, it is possible to obtain a better bonding result at the second bonding portion between the other end of the wire and the inner lead of the lead frame than that of the prior art, owing to the higher heating temperature of the inner lead heating part 12, thereby considerably improving the bonding effect.

Figure 6:
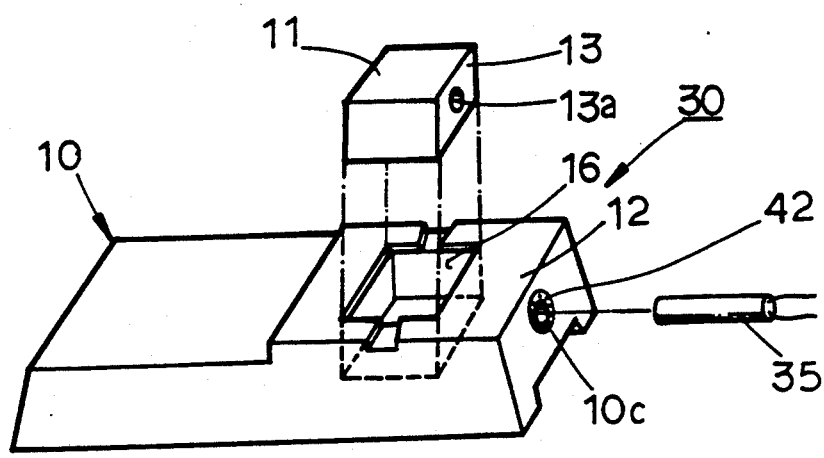
FIG. 6 is a partially exploded perspective view showing another embodiment of a heat block of a wire bonding machine according to this invention.

Referring next to FIG. 6 which is a partially exploded perspective view showing another embodiment of a heat block of a wire bonding machine according to this invention, the heat block includes another type of differential heating device 30 which is provided with a generally rectangular shaped opening 16 vertically formed at a center portion of an inner lead heating part 12 of an upper heating block 10. The opening 16 is adapted for receiving a separate-type chip heating block 13 made of a material of relatively lower thermal conductivity than that of the upper heating block 10. The upper heating block 10 has a receiving hole 10c which is formed as longitudinally machined in the upper block 10, provided therein with a tubular thermal insulation member 42, and adapted for receiving a third thermocouple 35 under the condition of surrounding the thermocouple 35 by the thermal insulation member 42. On the other hand, the chip heating block 13 has an upper surface functioning as a chip heating part 11, and a longitudinal hole 13a which receives a front end of the thermocouple 35 which is also received into the receiving hole 10c, thereby causing the thermocouple 35 to measure the heating temperature of the chip heating part 11.

In addition, this heat block is provided with the same lower heating block 20 as that of FIG. 1, which block 20 has the first heater 31 and the first thermocouple 33.

In bonding operation by using the heat block according to the second embodiment, the first heater 31 commonly heats the chip heating part 11 of the heating block 13 and the inner lead heating part 12 of the upper heating block 10 in order to obtain a proper heating temperature of the chip heating part 11 of the heating block 13 of about 200°±10° C. Thus, the inner lead heating part 12 of the upper heating block 10 is heated at a relatively higher temperature than the temperature of 200°±10° C. due to the relatively higher thermal conductivity thereof than that of the chip heating block 13, thereby accomplishing a good bonding result at the second bonding portion between the other end of the wire and the inner lead of the lead frame than that of the prior art.

Figure 7:
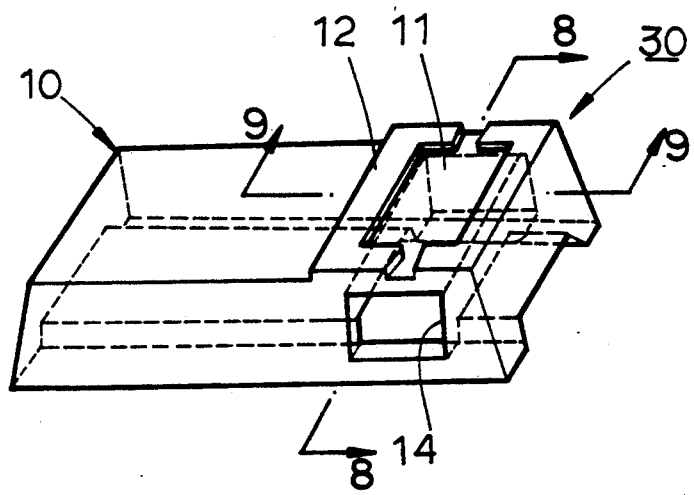
Figure 8:
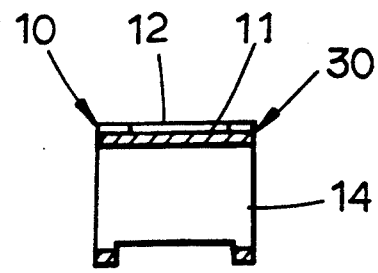
Figure 9:
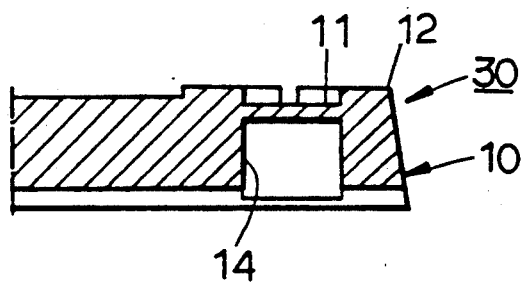

FIGS. 7 to 9 show a third embodiment of a heat block of a wire bonding machine according to this invention, respectively, the heat block includes another type of differential heating device 30 comprising a radiant opening 14 formed as crossly machined in the upper heating block 10 under a chip heating part 11 in order to allow the cooling air to circulate therethrough, thereby making it possible to differentially heat the chip heating part 11 and an inner lead heating part 12 of the upper heating block 10.

In this case, the heat block is also provided with the same shape of lower heating block 20 as represented in FIG. 1, said heating block 20 receives the first heater 31 and the first thermocouple 33 therein.

In result, it is appreciated that the heat blocks according to the second and third embodiments shown in FIGS. 6 to 9 each has only one heater, that is, the first heater 31 received in the lower heating block 20 for commonly heating the chip heating parts 11 and 11 and the inner lead heating parts 12 and 12. However, the heat blocks each accomplishes the desired differential heating for the heating parts 11, 11 and 12, 12 by adopting a difference in the thermal conductivity of the materials of the blocks 10 and 13 in case of the second embodiment and by using the radiant opening formed in the upper heating block 10 in case of the third embodiment. In result, the heater for commonly heating the heating parts 11, 11 and 12, 12 may be mounted on a desired heating block without distinction of the upper and lower heating blocks, as requested, and also mounted in a desired direction without distinction of the longitudinal and lateral directions.

Figure 10:
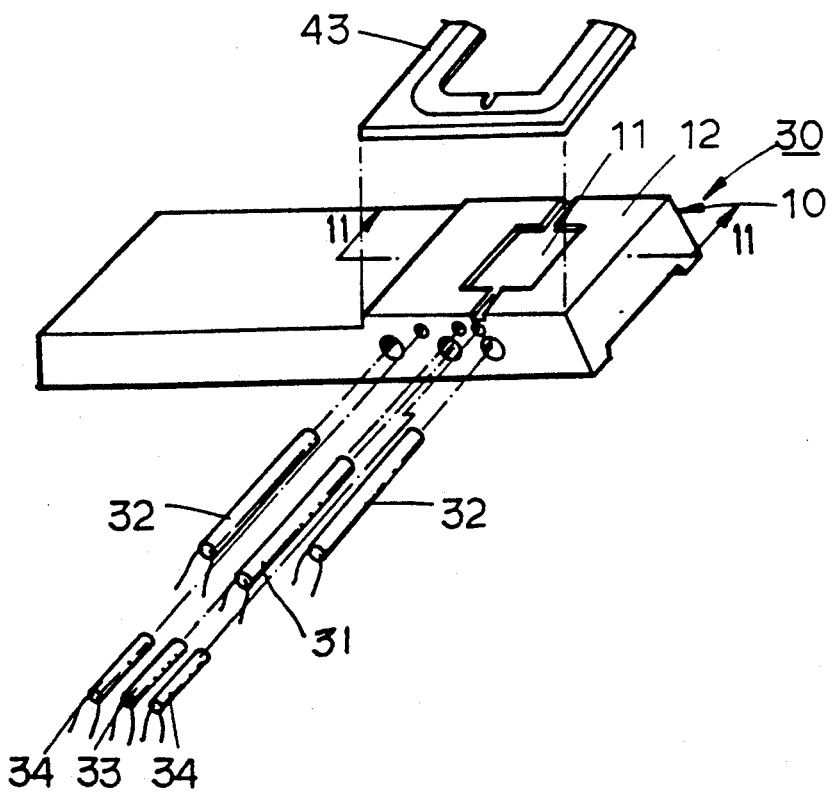
Figure 11:
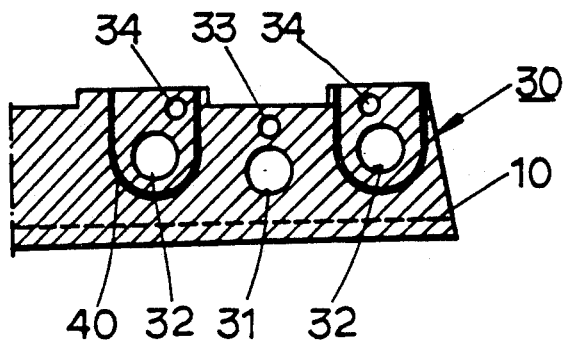

Turning to FIGS. 10 and 11 which show a fourth embodiment of a heat block of a wire bonding machine according to this invention, respectively, the heat block includes another type of differential heating device 30 which includes the first heater 31 and the first thermocouple 33 which are received in receiving holes 10a and 10c, respectively, which holes 10a and 10c are formed as crossly disposed in an upper heating block 10 under a chip heating part 11. The differential heating device 30 also includes the second heaters 32 and the second thermocouples 34 which are received in receiving holes 10b and 10d, respectively, which holes 10b and 10d are formed as crossly disposed in the both sides of the upper heating block 10 under an inner lead heating part 12. Here, the heaters and the thermocouples 31, 32, 33 and 34 are parallel to each other.

In this embodiment, the first and second heaters 31 and 32 differentially heat the chip heating part 11 and the inner lead heating part 12, respectively. In addition, there are provided the U-shaped cross-sectional thermal insulation members 40 which are disposed as laying in the upper heating block 10 in order to each surround one second heater 32 and one second thermocouple 34, as represented in FIG. 11.

In this embodiment, it is appreciated that the construction of the differential heating device 30 is similar to the construction of the differential heating device 30 according to the first embodiment except for the mounting position of the first heater 31 and the first thermocouple 33 so that the operational effect of the fourth embodiment will be referred to the description for the first embodiment.

In result, the bonding effect provided by the fourth embodiment is considerably improved owing to the relatively higher heating temperature of the inner lead heating part 12 than that of the chip heating part 11.

Figure 12:
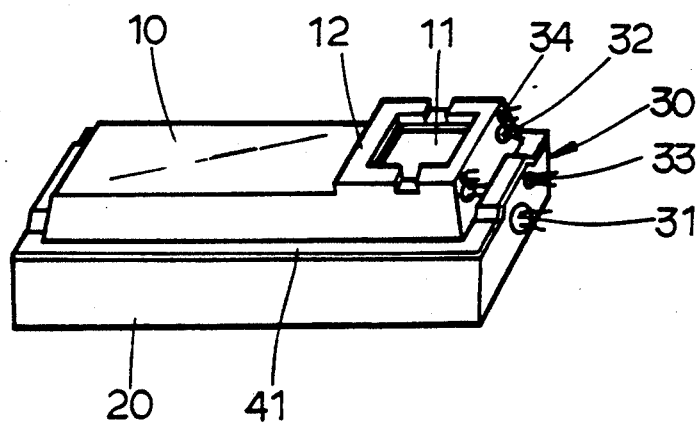
Figure 13:
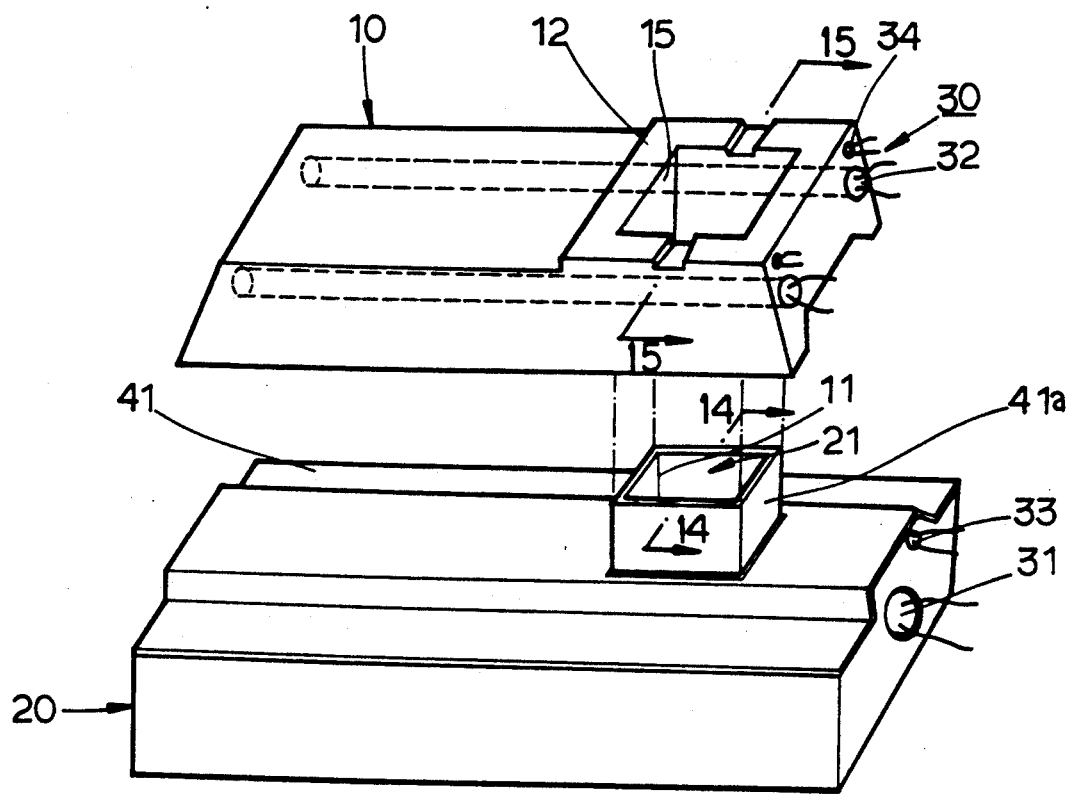
Figure 14:
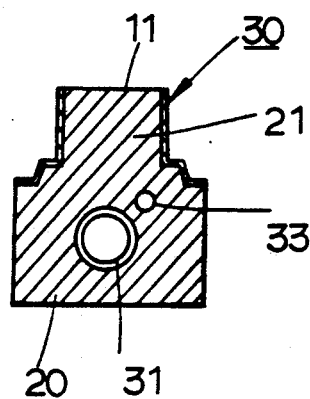
Figure 15:
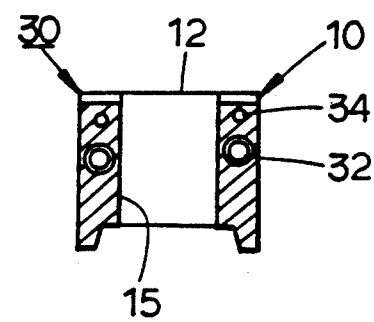

Referring to FIGS. 12 to 15, FIG. 12 is a perspective view showing a fifth embodiment of a heat block of a wire bonding machine according to this invention, FIG. 13 is an exploded perspective view of the heat block of FIG. 12, and FIGS. 14 and 15 are sectional views taken along the section lines F—F and G—G of FIG. 13, respectively.

As shown in the drawings, the heat block according the fifth embodiment includes another type of differential heating device 30 comprises a thermal insulation plate 41 disposed between upper and lower heating blocks 10 and 20, thereby making it possible to differentially heat the upper and lower blocks 10 and 20 under the condition of thermal insulation between the upper block 10 and the lower block 20. In addition, there is a generally rectangular insert opening 15 vertically formed inside an inner lead heating part 12 of the upper block 10. The lower heating block 20 is provided with a generally rectangular insert part 21 formed as upwardly extending from an upper surface thereof in order to be inserted into the insert opening 15 of the upper block 10. The insert part 21 is covered on the side surface thereof with a thermal insulation part 41a integrally formed with the thermal insulation plate 41. Here, the upper surface of the insert part 21 functions as a chip heating part 11 for heating the first bonding portion between one end of the wire and the semiconductor chip.

On the other hand, the upper heating block 10 is provided with the second heaters 32 and the second thermocouples 34 each received in each receiving hole formed as longitudinally disposed at both sides of the upper heating block 10, while the lower heating block 20 is provided with the first heater 31 and the first thermocouple 33 each received in each receiving hole formed as longitudinally disposed at a center portion of the lower heating block 20. In result, the first heater 31 heats the chip heating part 11 of the insert part 21, while the second heaters 32 heat the inner lead heating part 12 of the upper heating block 12. Additionally, there are provided thermal insulating plate 41 and the thermal insulating part 41a between the upper and lower heating blocks 10 and 20 so that the chip heating block 11 is insulated from the inner lead heating part 12. Therefore, upon differentially heating the chip heating part 11 and the inner leading part 12 by means of the first and second heaters 31 and 32, the inner lead heating part 12 is heated at a relatively higher temperature than that of the chip heating part 11 as described in the other embodiments, thereby accomplishing the considerable improvement of the bonding effect at the second bonding portion between the other end of the wire and the inner lead of the lead frame owing to the relatively higher temperature of the inner lead heating part 12.

As described above, the present invention provides a heat block of a wire bonding machine in which a chip heating part for bonding one end of a wire, such as gold wire, to a semiconductor chip is heated at a proper heating temperature, at which temperature the semiconductor chip is not injured, while an inner lead heating part for bonding the other end of the wire to an inner lead of a lead frame is heated at a relatively higher temperature than that of the chip heating part, thereby considerably improving the bonding effect at a bonding portion between the other end of the wire and the inner lead of the lead frame owing to the relatively higher heating temperature of the inner lead heating part than that of the chip heating part.

Although the perferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A heat block of a wire bonding machine comprising:
    an inner lead heating part for bonding each one end of wires to each inner lead of a lead frame;
    a chip heating part for bonding the other ends of said wires to a semiconductor chip; and
    heating means comprising at least a pair of heaters and a pair of thermocouples provided with a thermal insulation member to differentially heat said inner lead heating part and said chip heating part such that said inner lead heating part has a relatively higher temperature than that of said chip heating part.

2. A heat block of a wire bonding machine according to claim 1, wherein said differentially heating means comprises:
    a pair of second heaters and a pair of second thermocouples each of which is crossly provided in an upper heating block under said inner lead heating part, said upper heating block having said chip heating part and said inner lead heating part thereon;
    a first heater and a first thermocouple which are disposed in a lower heating block, on which lower heating block said upper heating block is supported; and
    thermal insulation members each of which is provided in said upper heating block in order to surround one of said heaters and one of said second thermocouples;
    whereby said heating means differentially heating the inner lead heating part and the chip heating part by using the thermal insulation between the inner lead heating part and the chip heating part.

3. A heat block of a wire bonding machine according to claim 1, wherein said differentially heating means comprises:
    a first heater and a first thermocouple which are crossly disposed in an upper heating block under said chip heating part, said upper heating block having said chip heating part and said inner lead heating part thereon;

a pair of second heaters and a pair of second thermocouples each crossly provided in each side of said upper heating block under the inner lead heating part; and thermal insulation members each of which is provided in said upper heating block in order to surround one second heater and one second thermocouple, whereby said heating means differentially heating the inner lead heating part and the chip heating part by using the thermal insulation between the inner lead heating part and the chip heating part.

4. A heat block of a wire bonding machine according to claim 1, wherein said differentially heating means comprises:

a thermal insulation plate which is disposed between upper and lower heating blocks for insulating therebetween, said upper heating block having said inner lead heating part thereon, said lower heating block being adapted for supporting said upper heating block thereon;

an insert opening vertically formed inside the inner lead heating part of the upper heating block; and an insert part which is formed as upwardly extending from an upper surface of said lower heating block in order to be inserted into said insert opening of the upper heating block, and is covered on the side surfaces thereof with a thermal insulation part which is integrally formed with said thermal insulation plate, said insert part having an upper surface functioning as said chip heating part;

a first heater and a first thermocouple which are longitudinally disposed in a center portion of the lower heating block; and a pair of second heaters and a pair of second thermocouples each longitudinally provided in each side of said upper heating block under the inner lead heating part, whereby said heating means differentially heating the inner lead heating part and the chip heating part by using the thermal insulation between the inner lead heating part and the chip heating part.

5. A heat block of a wire bonding machine comprising:

an inner lead heating part for bonding each one end of wires to each inner lead of a lead frame;

a chip heating part for bonding the other ends of said wires to a semiconductor chip; and heating means for heating said inner lead heating part and said chip heating part such that said inner lead heating part has a relatively higher temperature than that of said chip heating part, said heating means comprising:

a radiant opening formed in an upper heating block under said chip heating part in order to allow a radiant air to circulate therethrough, said upper heating block having said chip heating part and said inner lead heating part thereon; and a heater and a thermocouple which are mounted in one of said upper heating block and a lower heating block, said lower heating block adapted for supporting said upper heating block thereon, whereby said heating means differentially heating said chip heating part and said inner lead heating part by using a radiant air circulation through said radiant opening.

6. A heat block of a wire bonding machine comprising:

an inner lead heating part for bonding each one end of wires to each inner lead of a lead frame;

a chip heating part for bonding the other ends of said wires to a semiconductor chip, said inner lead heating part and said chip heating part being made of materials with different thermal conductivity; and heating means for differentially heating said inner lead heating part and said chip heating part such that said inner lead heating part has a relatively higher temperature than that of said chip heating part.

7. A heat block of a wire bonding machine according to claim 6, wherein said heating means comprises:

an insert opening which is vertically formed at a center portion of said inner lead heating part of an upper heating block, said upper heating block having said inner lead heating part thereon;

a separate-type chip heating block which is made of a material of relatively lower thermal conductivity than that of said upper heating block and adapted for being received in said insert opening, said chip heating block having an upper surface functioning as said chip heating part; and a heater and a thermocouple which are mounted in one of said upper heating block and a lower heating block, said lower heating block adapted for supporting said upper heating block thereon, whereby said heating means differentially heating said chip heating part and said inner lead heating part by using a difference of the thermal conductivity between the materials of the chip heating block and the upper heating block.

* * * * *